United States Patent [19]

Fukuda et al.

[11] Patent Number: 4,905,195
[45] Date of Patent: Feb. 27, 1990

[54] SEMICONDUCTOR MEMORY

[75] Inventors: Minoru Fukuda, Tateno; Hideaki Takahashi, Koganei, both of Japan; June Sugiura, Troy, N.Y.; Fumio Tsuchiya, Kodaira; Toshimasa Kihara, Tachikawa, both of Japan

[73] Assignee: Hitachi, Ltd., Tokyo, Japan

[21] Appl. No.: 277,131

[22] Filed: Nov. 29, 1988

Related U.S. Application Data

[62] Division of Ser. No. 75,986, Jul. 21, 1987, Pat. No. 4,788,665, which is a division of Ser. No. 770,576, Aug. 29, 1985, Pat. No. 4,691,298.

[30] Foreign Application Priority Data

Sep. 26, 1984 [JP] Japan .................. 59-199576

[51] Int. Cl.$^4$ .................................. G11C 7/00
[52] U.S. Cl. ..................... 365/189.05; 365/230.06
[58] Field of Search ............... 365/189, 194, 195, 219, 365/220, 221, 230, 233, 239, 189.05, 230.06

[56] References Cited

U.S. PATENT DOCUMENTS

| | | | |
|---|---|---|---|
| 4,130,900 | 12/1978 | Watanabe | 365/230 |
| 4,691,298 | 9/1987 | Fukuda et al. | 365/189 |
| 4,788,665 | 11/1988 | Fukuda et al. | 365/189 |

Primary Examiner—Joseph A. Popek
Attorney, Agent, or Firm—Antonelli, Terry & Wands

[57] ABSTRACT

An electrically programmable read only memory is equipped with latch circuits for sequentially introducing series signals which are fed through external terminals. The converter includes sequentially operated switch elements and latch circuits in order to convert the series signals into parallel signals. The thus converted parallel signals are written simultaneously in a memory array via address decoder operated selection switch elements. According to this method, the writing operations into the memory array can be conducted at a high speed even when one writing operation is relatively long as a result of this parallel signal action.

27 Claims, 4 Drawing Sheets

SEMICONDUCTOR MEMORY

This is a divisional application of Ser. No. 07/075,986, filed July 21, 1987, now U.S. Pat. No. 4,788,665, which is a divisional application of Ser. No. 06/770,576, filed Aug. 29, 1985, now U.S. Pat. No. 4,691,298.

BACKGROUND OF THE INVENTION

1. Field of the Invention

The present invention relates to a semiconductor memory and, more particularly, to a technique which is effective for use in an EPROM (i.e., Electrically Programmable Read Only Memory), for example.

2. Description of the Prior Art

In the writing operation of the programmable ROM of the prior art, write data are input from an input terminal for each writing cycle. Accordingly, the EPROM device of the prior art, for example, takes as long as 50 ms for one writing cycle so that the time required for writing all the bits is relatively long for a larger memory capacity.

SUMMARY OF THE INVENTION

An object of the present invention is to provide a programmable ROM which can realize high-speed writing.

Another object of the present invention is to provide a programmable ROM aimed at speeding up reading.

Still another object of the present invention is to provide a semiconductor memory which can realize high-speed writing and reading.

A further object of the present invention is to provide a semiconductor memory aimed at increasing the number of its functions in addition to realizing high-speed reading and writing.

These and other objects and novel features of the present invention will become apparent from the following description to be made hereinafter with reference to the accompanying drawings.

The representative of the inventions to be disclosed herein will be summarized briefly in the following.

That is to say, a plurality of data to be fed through one terminal are converted to parallel data by a latch circuit, and the parallel data thus converted are written to a memory array in one operation; consequently, writing is speeded up.

DESCRIPTION OF THE PREFERRED EMBODIMENTS

Embodiment 1

Figure 1:
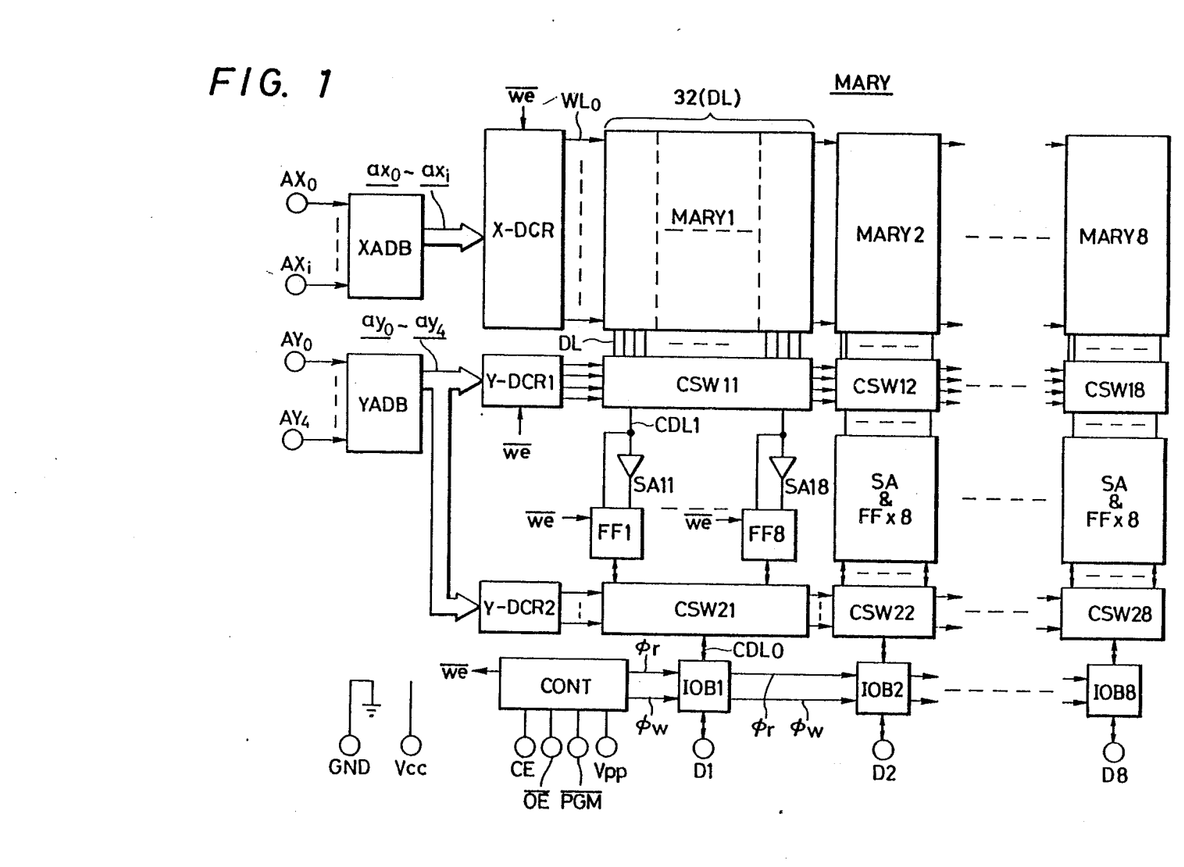
FIG. 1 is a block circuit diagram showing the programmable ROM according to a first embodiment of the present invention.

FIG. 1 is a block diagram showing the EPROM device which exemplifies the present invention.

The circuit elements in each circuit block of FIG. 1, are formed on a semiconductor substrate of single crystalline silicon by a known technique of fabricating the known MOS (i.e., Metal Oxide Semiconductor) integrated circuit.

In this EPROM device, complementary address signals $\overline{ax}_0$ to $\overline{ax}_i$ and $\overline{ay}_0$ to $\overline{ay}_4$, which are generated by address buffers XADB and YADB, respectively, in response to row and column address signals fed from external terminals $AX_0$ to $AX_i$ and $AY_0$ to $AY_j$, respectively, are inputted to address decoders X-DCR, Y-DCR1 and Y-DCR2.

In response to the aforementioned complementary address signal $\overline{ax}_0$ to $\overline{ax}_i$, the row address decoder X-DCR generates a selection signal to be fed to the word lines WL of a memory array MARY. The row address decoder X-DCR has its operations controlled by both a write high voltage fed to an external terminal $V_{pp}$ and a write control signal $\overline{we}$ output from a control circuit CONT. If the control signal $\overline{we}$ is at a high level substantially equal to the supply voltage $V_{cc}$ (at 5 V) of the circuit, the selection signal to be output from the row decoder X-DCR is set, irrespective of the level of the external terminal $V_{pp}$, at either a selection level substantially equal to the voltage $V_{cc}$ or a non-selection level substantially equal to 0 V. If the control signal $\overline{we}$ is set at a low level substantially equal to 0 V and if the terminal $V_{pp}$ is set at a write voltage level such as 12.5 V, conversely, the selection signal to be output from the row decoder X-DCR is accordingly set at either a selection level substantially equal to the write voltage level or a non-selection level substantially equal to 0 V.

The memory array MARY is constructed of the electrically programmable memory elements composed of FAMOS (i.e., Floating-gate Avalanche-injection MOS), although it is not particularly limited to this configuration, and has its control gates joined to the corresponding word lines WL. In the present embodiment, the memory array MARY is constructed of eight memory arrays MARY1 to MARY8, although it is not particularly limited to that configuration.

The first column address decoder Y-DCR1 generates a signal for selecting the data lines DL of the memory array MARY in response to two bits, for example, of the complementary address signals $\overline{ay}_0$ to $\overline{ay}_4$. The selection signal of the column address decoder Y-DCR1 is fed to column switch circuits CWS11 to CWS18. Here, the memory array MARY1 has thirty two data lines DL, although it is not particularly limited to that configuration. Eight first common data lines CDL1 to CDL8 are provided to correspond to the memory array MARY1. In other words, four data lines of the memory array MARY1 correspond to each of the first common data lines CDL1 to CDL8. In accordance with this, the first common data line CDL1, for example, is connected to whichever of the corresponding four data lines of the memory array MARY1 as is selected by the column switch circuit CSW11 (as will be described in the following with respect to the memory array MARY1 as an example). Thus, the address signals inputted to the aforementioned first column address decoder Y-DCR1 are two-bit complementary address signals, and the first common data lines are eight in number. The first column address decoder Y-DCR1 has its operations controlled by the write control signal $\overline{we}$ like the row address decoder X-DCR. Specifically, the selection signals to be outputted from the decoder Y-DCR are set at either the selection level substantially equal to the write high voltage $V_{pp}$ or the non-selection level substantially equal to 0 V if the control signal $\overline{we}$ is at the low level. Each column switch circuit transmits the data signals at the high voltage level (i.e., the write voltage level) without any substantial level drop because the selection signals of the first column address decoder Y-DCR1 are set at a sufficiently high selection level.

In the memory array MARY described above, although not shown in detail, the control gates of the FAMOS transistors arranged on a common row are connected with the respectively corresponding word lines WL, and the drains of the FAMOS transistors arranged on a common column are connected with the respectively corresponding data lines DL. The sources of the respective FAMOS transistors are shared commonly and are grounded through a resistor means which is composed of depletion MOSFETs or the like, although FAMOS transistors are not especially limited to such structural configuration.

On the eight first common data lines CDL1 to CDL8, there are disposed sense amplifiers SA11 to SA18 and latch circuits FF1 to FF8 which are represented by flip-flop circuits and have data memory functions. In reading, more specifically, the sense amplifier SA11 to SA18 amplify the micro signals, which are obtained on the common data lines CDL1 to CDL8, to transmit them to the latch circuits FF1 to FF8. In writing, the write signals held by the latch circuits FF1 to FF8 are transmitted to the respective common data lines CDL1 to CDL8.

The respective latch circuits FF to FF8 introduce and hold the data signals which are output from the sense amplifiers SA11 to SA18. The output of each latch circuit is fed to each first common data line, but the circuit is not particularly limited to that configuration, and further to a second column switch circuit CSW21, which will be described hereinafter. On the other hand, each of the latch circuits FF1 to FF8 introduces the output signal of an input/output buffer IOB1 when that signal is fed through the second column switch circuit CSW21. The input/output buffer IOB1 is made to have a relatively large drive capacity, although it is not particularly limited to this configuration. In accordance with this, the data held in each latch circuit are made coincident with the data which are fed from the input/output buffer IOB1, irrespective of the outputs of the sense amplifiers SA11 to SA18.

Each of the latch circuits FF1 to FF8 has its operation controlled by the write control signals $\overline{we}$. The data signal fed from each latch circuit to the first common data line is set at either the high level substantially equal to the level of the write voltage terminal $V_{pp}$ or the low level substantially equal to 0 V if the control signals $\overline{we}$ are set at the low level substantially equal to 0 V.

The present embodiment is equipped with the second column address decoder Y-DCR2, which is operative to generate selection signals for selecting the aforementioned first common data lines CDL1 to CDL8 and the second column switch circuit CSW21. One of the first common data lines CDL1 to CDL8 is selected by the second column switch circuit CSW21 and is joined to a second common data line CDL0. As a result, three-bit complementary address signals are fed to the second address decoder Y-DCR2 so that the eight first common data lines CDL1 to CDL8 may be selected. Between the second common data line CDL0 and an external terminal D1, there is connected the input/output buffer IOB1. This input/output buffer IOB1 is constructed, although not shown in detail, as a writing data input buffer and a reading data output buffer. The second common data line CDL0 is connected with the output terminal of the data input buffer and the input terminal of the data output buffer.

The input/output buffer IOB1 has its operations controlled by control signals $\phi_r$ and $\phi_w$ which are output from the control circuit CONT. The data output buffer in the input/output buffer IOB1 is rendered operative, if the control signal $\phi_r$ is at a high level, and inoperative if the same signal $\phi_r$ is at a low level. The data output buffer in its inoperative state is brought into a high output impedance state. The data input buffer in the input/output buffer is rendered operative, if the control signal $\phi_w$ is at a high level, and inoperative if the same signal $\phi_w$ is at a low level. The data input buffer in its inoperative state is brought into a high output impedance state.

The circuit construction described above applies similarly to the remaining memory arrays MARY2 to MARY8, and its description is omitted here.

In this construction, the ROM of the present embodiment is made into a memory in the byte (i.e., 8 bits) mode. If the word lines WL are 256 in number, for example, the ROM has a total memory capacity of about 64K (i.e., 8K×8) bits.

The control circuit CONT receives through the external terminals a chip enable signal $\overline{CE}$, an output enable signal $\overline{OE}$, a program signal $\overline{PGM}$ and the write high voltage $V_{pp}$ to generate a variety of timing signals and control signals which are necessary for writing and reading, as will be described hereinafter.

When the chip enable signal $\overline{CE}$ (which will be shortly referred to as the "$\overline{CE}$ signal") and the $\overline{OE}$ signal are set at the low level indicating the read mode, the control signal $\phi_r$ is accordingly set at the high level. At this time, the control signal $\overline{we}$ is maintained at the high level.

If the $\overline{CE}$ signal is set at the low level, if the terminal $V_{pp}$ is set at the relatively low voltage level substantially equal to 0 V or the supply voltage $V_{cc}$ and if the $\overline{PGM}$ signal is set at the low level, although it is not particularly limited to that configuration, the combination of these signals can be deemed as a write data preset mode. In this preset mode, more specifically, the control signal $\phi_w$ is set at the high level.

If the $\overline{CE}$ signal and the $\overline{PGM}$ signal are set at the low level and if the terminal $V_{pp}$ is set at the write voltage level substantially equal to 12.5 V, the combination of these signals can be deemed as a write operation mode. In this write operation mode, the control signal $\overline{we}$ is set at the low level.

The writing operations of the programmable ROM of the present embodiment will now be described.

First of all, the $\overline{CE}$ signal and the $\overline{PGM}$ signal are set at the low and high level, respectively, and the voltage $V_{pp}$ is set at the low voltage level.

The first 8-bit data to be written are applied to the eight data external terminals D1 to D8, and column address signals $AY_0$ to $AY_4$ are set so that the first latch circuits FF1 may be selected by the second column switch. Next, the control signal $\phi_w$ is set at the high level as a result that the $\overline{PGM}$ signal is set at the low level. As a result that the control signal $\phi_w$ is set at the high level, the data input buffers of the respective input-/output buffers IOB1 to IOB8 are rendered operative. As a result, the latch circuits FF1 are set with the first 8-bit data.

After the $\overline{\text{PGM}}$ signal is set at the high level, i.e., after the control signal $\phi_w$ is set at the low level, the second 8-bits of data are applied to the external terminals D1 to D8 so that the column address signal indicating the second latch circuits is set, although this is not shown. The $\overline{\text{PGM}}$ signal is set again at the low level. In response to this, the second 8-bit data are set in the second latch circuits.

By repeating similar operations, the data are sequentially input to the latch circuits.

After the end of the data input to the latch circuits, the terminal $V_{pp}$ is set at the write voltage level substantially equal to 12.5 V, and the $\overline{\text{PGM}}$ signal is set at the low level. The $\overline{\text{CE}}$ signal and the $\overline{\text{PGM}}$ signal are set at the low level, and the terminal $V_{pp}$ is set at the write voltage level so that the write control signal $\overline{\text{we}}$ is set at the low level. As a result of the control signal $\overline{\text{we}}$ being set at the low level, the data signals at the write voltage level are output from the latch circuits, and the selected signals at the high voltage level are outputted from the row address decoder X-DCR and the column address decoder Y-DCR1. As a result, the data are written in the memory cells which are selected by the address decoders X-DCR and Y-DCR1. The respective memory cells are caused to take the low or high threshold voltage according to the write data.

According to this embodiment, thus, it is possible to write data of totally 8×8 bits, i.e., 64 bits in one writing cycle.

As a result, in case the word lines WL are 256 in number, the writing operations of all bits are ended in the writing operation cycle of 256×4 times, i.e., 1,024 times. Since the time period required for the sequential data input to the latch circuits FF1 to FF8 terminates for about several micro seconds, the writing operations can be undergone at such a high speed as can be neglected, as compared with the one writing cycle as long as about 50 micro seconds.

In the operation of reading the memory data of the memory cells, let the case be considered, in which the memory cells selected by the address decoder X-DCR and Y-DCR1 have such a high threshold voltage which indicates the "off" state irrespective of the word line selecting level. In this case, the first common data line is set at a relatively high level according to the bias voltage coming from the corresponding sense amplifiers. In the case where the memory cells selected are caused to take such a low threshold voltage as are turned on by the word line selecting level, on the other hand, the first common data line is set at a relatively low level. This read signal fed by the memory cells to the first common data line is amplified by the sense amplifiers and is transmitted to the latch circuits. In this case, the latch circuits FF1 to FF8 hold the data of the respectively corresponding sense amplifiers SA11 to SA18 and act substantially as the main amplifiers.

Of the data being held by the latch circuits FF1 to FF8, moreover, the output of one latch circuit is transmitted to the second common data line DCL0 until it is sent out from the external terminal D1 through the data output buffer. Similar writing and reading operations are performed for the remaining memory arrays MARY2 to MARY8.

Embodiment 2

Figure 2:
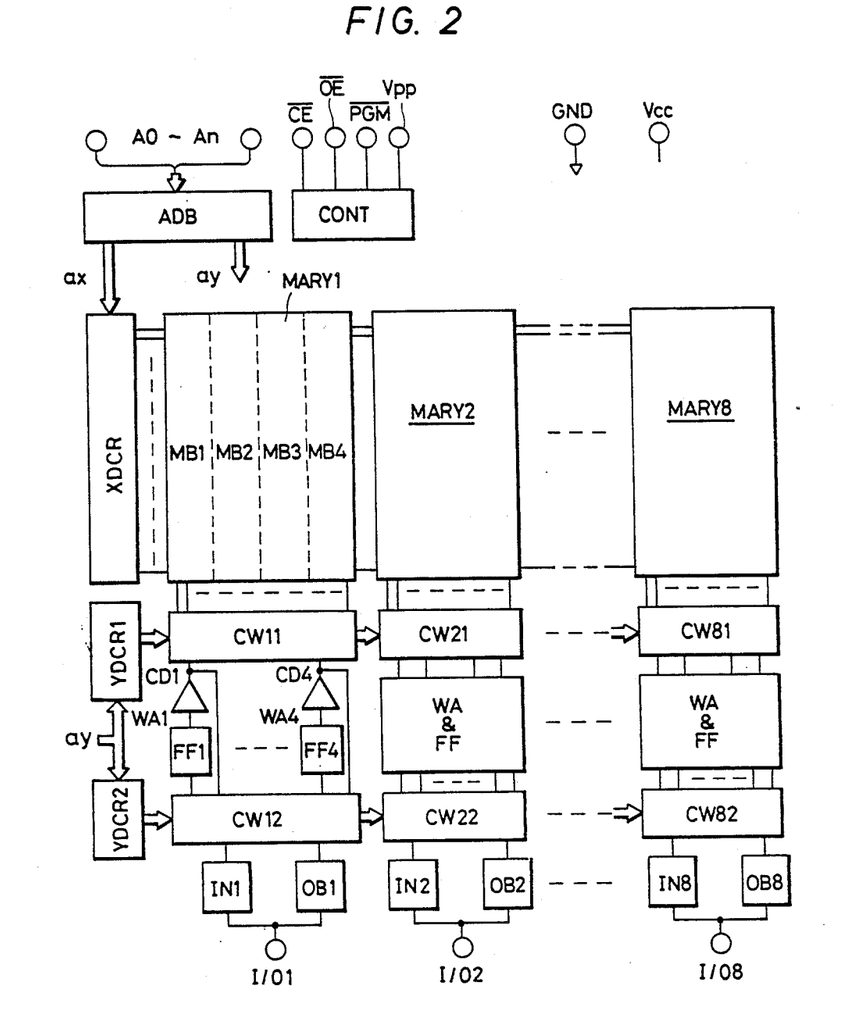
FIG. 2 is a block circuit diagram showing the programmable ROM according to a second embodiment of the present invention.

FIG. 2 is a block diagram showing another embodiment in case the present invention is applied to the EPROM device of the second embodiment. From this block diagram is omitted a detailed circuit which is shown in FIG. 3, as will be described hereinafter.

Figure 3:
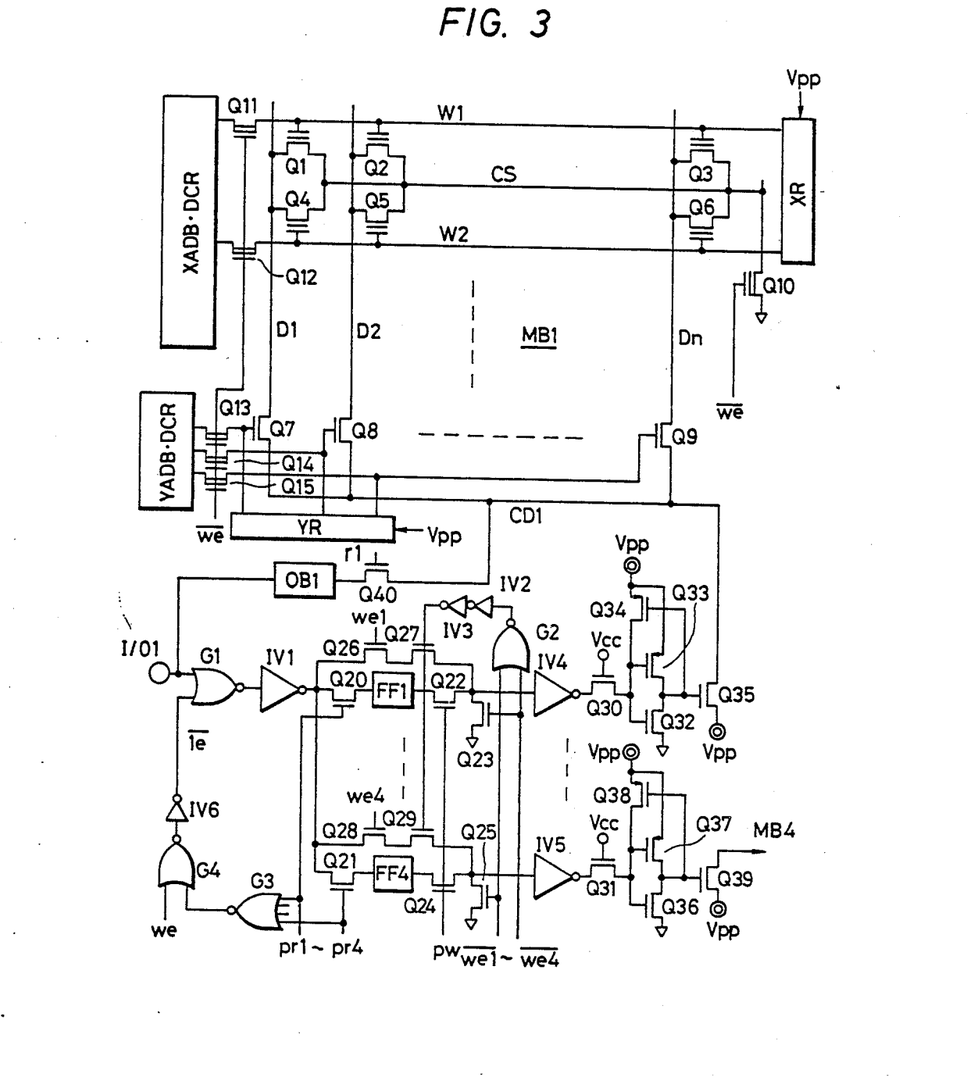
FIG. 3 is a circuit diagram showing an essential portion of FIG. 2.

The circuit elements comprising the respective circuit blocks of FIG. 3 are formed on the semiconductor substrate of a single crystalline silicon, although not especially limited to this configuration, by the well-known integrated circuit fabricating technique.

In the memory array, there are arranged in a matrix form the memory elements which are composed of the FAMOS (i.e., Floating-gate Avalanche-injection MOS) transistors. These FAMOS transistors have their drains joined to the data lines of the memory array and their control gates joined to the corresponding word lines. More specifically, in the memory array MARY described above, the control gates of the FAMOS transistors arranged on a common row are connected with the respectively corresponding word lines, and the drains of the FAMOS transistors arranged on a common column are connected with the respectively corresponding data lines. The sources of the respective FAMOS transistors are shared commonly and are grounded to the ground potential point of the circuit through resistor means which is composed of depletion MOSFETs or the like, although not especially limited thereto, as will be clarified from FIG. 3. This embodiment is equipped with the eight memory arrays MARY1 to MARY8, although not especially limited to this configuration. As a result, the access is conducted basically at a unit of 8 bits. In order to speed up writing, in this embodiment, each of the memory arrays MARY1 to MARY8, as exemplified by the memory array MARY1, is divided into four memory blocks MB1 to MB4 in the direction of the data lines, although not especially limited to that configuration. For the respective memory blocks MB1 to MB4, there are provided common data lines CD1 to CD4 which are made to correspond thereto one-to-one. The data lines of the memory blocks MB1 to MB4 are joined to the four common data lines CD1 to CD4 through a first column selection circuit CW11. For the respective memory blocks of the remaining memory arrays MARY2 to MARY8, there are also provided similar first column selection circuits CW21 to CW81.

To the aforementioned common data lines CD1 to CD4, there are joined the output terminals of write circuits WA1 to WA4 which respond to the data held in the latch circuits FF1 to FF4, respectively. To the inputs of these latch circuits FF1 to FF4, there is fed through the second column selection circuit CW12 the write signal which is fed sequentially from one external terminal I/O1 through the data input circuit. For high-speed reading, a second column selection circuit CW12 is made to have a signal transmission path for joining the four common data lines CD1 to CD4 selectively to a read circuit OB1.

The remaining memory arrays MARY2 to MARY8 are also equipped with similar write circuits WA, latch circuits FF and second column selection circuits CW22 to CW82.

The address signals fed from external terminals A0 to An are fed to an address buffer ADB, in which they are converted to internal complementary address signals ax and ay composed of address signals in phase and antiphase with the aforementioned address signals A0 to An, until they are transmitted to the address decoders X-DCR, Y-DCR1 and Y-DCR2.

The address decoder X-DCR generates a selection signal for selecting the word lines of the memory arrays MARY1 to MARY8 in response to the complementary address signal ax. As a result, 8×4×M pieces of memory elements are selected. Here, M designates the number of the data lines which are arranged in each memory block.

The first address decoder Y-DCR1 decodes such one of the aforementioned complementary address signals ay as has a predetermined number of bits to generate a selection signal for selecting one data line of each memory block. As a result, in each of the memory arrays MARY1 to MARY8, four data lines are selected and joined to the respectively corresponding common data lines CD1 to CD4. These four common data lines CD1 to CD4 are joined at one hand to the output terminals of the write circuits WA1 to WA4 exemplified. These write circuits WA1 to WA4 have their input terminals equipped with the latch circuits FF1 to FF4 which are represented by the flip-flop circuits to have data storing functions. In these latch circuits FF1 to FF4, there are selectively taken through the second column selection circuit CW12 the four-bit write signals which are sequentially fed from the external terminal I/O1 through a data input circuit IN1. More specifically, the second address decoder Y-DCR2 decodes such one complementary address signal of the aforementioned complementary address signals ay as has two bits to join the output terminal of the data input circuit IN1 and the input terminals of the latch circuits FF1 to FF4 in a sequential manner. The column selection circuit CW12 is equipped, although not shown, with a signal transmission path for joining the output terminal of the data input circuit IN1 directly to the input terminals of the corresponding write circuits WA1 to WA4 in accordance with the aforementioned address signals to enable the data to be written at a unit of one bit.

In order to realize high speed reading, the four common data lines CD1 to CD4 are selected by the second column selection circuit CW12 and are joined to the read circuit OB1.

The circuit constructions described above are similar to those of the remaining memory arrays MARY2 to MARY8, and their descriptions are omitted here.

The control circuit CONT responds to the chip enable signal $\overline{CE}$, the output enable signal $\overline{OE}$, the program signal $\overline{PGM}$ and the write high voltage $V_{pp}$ from the external terminals to generate those various timing signals and control signals as are necessary for the two kinds of write modes and for the read mode.

FIG. 3 is a specific circuit diagram showing the aforementioned memory block MB1 and its write/read circuit.

The EPROM device of this embodiment is operated by the supply voltage $V_{cc}$ as at +5 V and by the write voltage $V_{pp}$ at a high level of ten and several volts. The EPROM device is operated in the usual reading operation by the supply voltage $V_{cc}$ being at +5 V.

The memory block MB1 is composed of a plurality of FAMOS transistors Q1 to Q6, word lines W1 to W2 and data lines D1, D2 to Dn. In the memory block MB1, the control gates of the FAMOS transistors Q1 to Q3 (or Q4 to Q6), arranged on a common row, are connected with the respectively corresponding word lines W1 and W2, and the drains of the FAMOS transistors Q1, Q4, Q2, Q5, Q3 and Q6, arranged on a common column, are connected with the respectively corresponding data lines D1 to Dn. The common source line CS of the aforementioned FAMOS transistors is grounded through a depletion MOSFET Q10 which is made receptive to the write signal $\overline{we}$, although it is not specifically limited to that configuration. This MOSFET Q10 is provided for the following reason. In the case where the memory cell, e.g., the cell Q1, is to be written with data, more specifically, the high voltage at the write level is applied to the word line W1, and either the high voltage according to the data to be written or the low voltage substantially at 0 V is applied to the data line D1. In this case, the floating gate of the memory cell such as Q4 to be joined to the selection data line D1 but to be left unselected has its potential raised undesirably as the data line D1 takes a high potential, because it is coupled electrostatically to the data line D1. This results in undesired conduction of the memory cell Q4 which should be maintained in its "off" state because it is not selected. In other words, a leakage current flows through the unselected memory cell Q4 thereby reducing the write current flowing through the selected memory cell Q1. The MOSFET Q10, as shown, has its conductance reduced to a relatively small value by the low level of the internal control signal $\overline{we}$ when in the writing operation. As a result, the potential at the common source line CS to be established by the write current introduced through the memory cell Q1 when in the writing operation is raised to a relatively high value because the conductance of the MOSFET Q10 is set at a relatively low level. In this common source line CS has its potential set at a relatively high level, the FAMOS transistor to be selected has its threshold voltage set at a relatively high level by the substrate effect. Since the effective threshold voltage of the unselected FAMOS transistor thereby is set at the high level, the leakage current which will flow through the FAMOS transistor that is unselected is reduced. As a result, the write current is supplied efficiently to the selected FAMOS transistors so that effective data writing into the selected memory cell can result. During the reading operation, the conductance of the MOSFET Q10 is increased to a relatively high level in response to the high level of the aforementioned control signal $\overline{we}$. As a result, the current flow through the FAMOS transistor when writing a logic "1" can be increased to speed up reading.

In FIG. 3, the aforementioned address buffer ADB, address decoder X-DCR and first address decoder Y-DCR1 are represented at a circuit block XADB·DCR by joining the address buffer ADB and the X-address decoder X-DCR, and the aforementioned address buffer ADB and first address decoder Y-DCR1 are together represented by a circuit block YADB·DCR.

The X-address decoder X-DCR is operated by the supply voltage at +5 V, although not especially limited thereto. As a result, the X-address decoder X-DCR generates a selection signal corresponding to 5 V. Conversely, the level of the selection signal necessary for the memory array is 5 V for the high level and is 0 V for the low level during the reading operation and the high level is at about the write voltage $V_{pp}$ and the low level is at about 0 V during the writing operation. In order that the word lines of the memory array may attain the required levels in response to the selection signal of 5 V output from the X-address decoder X-DCR, depletion MOSFETs Q11 and Q12 are connected between the output terminals of the X-address decoder X-DCR and the respective word lines of the memory array, and a write high-voltage load circuit XR is connected between the respective word lines and the write voltage terminal $V_{pp}$. The write high-voltage load circuit XR, although not specifically shown, comprises a plurality of high-resistance elements of high-resistance polysilicon layer, which are connected between the terminal $V_{pp}$ and the respective word lines.

The aforementioned depletion MOSFETs Q11 and Q12 have their gates fed with the internal write control signal $\overline{we}$ of 5 V, which is outputted from the control circuit CONT.

During the reading operation, the internal write control signal $\overline{we}$ is set at the high level of about 5 V. In this case, both the MOSFETs Q11 and Q12 are turned on in response to the selection signal of 5 V, which is outputted from the X-address decoder X-DCR. As a result, the output of the X-address decoder X-DCR is transmitted to the respective word lines.

During the writing operation, the internal write control signal $\overline{we}$ is set at the low level of about 0 V. If, in this case, one of the signals output from the X-address decoder X-DCR which corresponds to the word line W1 is at the high level (or selection level) of about 5 V, the MOSFET Q11 is automatically brought into its "off" state because the voltage applied to its gate takes a relatively negative level with respect to the voltage applied to its source. In accordance with this, the word line W1 is set at the high level of about the write voltage $V_{pp}$ by the action of the circuit XR. If the signal of the X-address decoder X-DCR corresponding to the word line W2 is at the low level of about 0 V, conversely, the MOSFET Q12 is left in its "on" state. As a result, the word line W2 is set at the low level of about 0 V by the row address decoder X-DCR.

In FIG. 3, the memory block MB1 is equipped with the common data line CD1. Between the data line of the memory block MB1 and the common data line CD1 corresponding to the former, there are connected MOSFETs Q7 to Q9 which together comprise the first column selection circuit CW11.

The Y-address decoder Y-DCR is operated by the supply voltage of 5 V like the X-address decoder X-DCR. The selection signal outputted from the Y-address decoder Y-DCR controls the column selection circuit. Here, this column selection circuit is required, when writing, to have the ability to transmit the write signal at the write voltage level. In order that the column switch MOSFETs Q7 to Q9 may be sufficiently turned on or off, depletion MOSFETs Q13 to Q15 are arranged between the output terminal of the Y-address decoder Y-DCR and the gates of the column switch MOSFETs Q7 to Q9, i.e., the column selection lines. These MOSFETs Q13 to Q15 have their gates fed with the internal write control signal $\overline{we}$ like the foregoing MOSFETs Q11 to Q12. Between each of the column selection lines and the write high voltage $V_{pp}$, there is disposed a write high-voltage load circuit YR which is similar to the aforementioned circuit XR.

The common data line CD1 is, at one point, joined to the output terminal of the following write circuit.

This write circuit is joined to the input terminal of a CMOS inverter circuit comprising N-channel MOSFET Q32 and a P-channel MOSFET Q33, which receive the write signal through a transmission gate MOSFET Q30 having its gate fed steadily with the supply voltage $V_{cc}$. This CMOS inverter circuit is operated by the high voltage $V_{pp}$. In order that the P-channel MOSFET Q33 may be brought into an "off" state by the high level of the write signal of 5 V fed through the aforementioned transmission gate MOSFET Q30, a P-channel MOSFET Q34 is connected between the shared gates of the MOSFETs Q33 and Q32 and the high voltage $V_{pp}$. That MOSFET Q34 has its gate joined to the output terminal of the aforementioned CMOS inverter circuit. The output terminal of this CMOS inverter circuit is connected to the gate of a write MOSFET Q35 which in turn has its drain connected to the high voltage $V_{pp}$ and its source connected to the common data line CD1. The common data line of another memory block, e.g., a not-shown MB4 is equipped with a write circuit which comprises MOSFETs Q31 and Q36 to Q39 similar to the aforementioned one.

The output signals of the latch circuits FF1 and FF4, exemplified as representatives, are fed to the inputs of the respective write circuits through transmission gate MOSFETs Q22 and Q24 composing the second column selection circuit CW12 and through CMOS inverter circuits IV4 and IV5. A write control signal pw, which is called the "page mode" in the present invention, is fed to the gates of the transmission gate MOSFETs Q22 and Q24. In the present invention, more specifically, the operation of writing the 4-bit write signal all at once is called the page mode, which is differentiated from the bit-by-bit writing mode. The output signal of the CMOS inverter circuit IV1 of the data input circuit is introduced selectively into the latch circuits FF1 to FF4 through transmission gates MOSFETs Q20 and Q21. To the gates of these MOSFETs Q20 and Q21, there are fed selection signals pr1 to pr4 which are generated in accordance with a page mode signal generated by combining the signal prepared by decoding the 2-bit address signal and a control signal fed from the external terminal, as will be described hereinafter. As a result, the write signals fed sequentially are introduced into the respective latch circuits FF1, FF4 and so on through the transmission gate MOSFETs Q20 and Q21 which are alternatively brought into the "on state" in response to the aforementioned selection signals pr1 to pr4.

According to the present embodiment, in order to enable writing selectively for each one bit (or totally 8 bits) of the four-divided memory blocks of each of the memory arrays MARY1 to MARY8 separately of the aforementioned page mode operation, there is provided a signal transmission path which comprises transmission gate MOSFETs Q26, Q27, Q28 and Q29 for transmitting the output signal of the data input circuit IN1 comprising a NOR gate circuit G1 and the CMOS inverter circuit IV1 selectively to the input terminals of the write circuits. Those transmission gate MOSFETs Q26 and Q28 have their gates fed with write signals $\overline{we}1$ to $\overline{we}4$ which are prepared alternatively by taking a logic "AND" between the signal decoded from the 2-bit address signal and the usual write signal we. To the gates of the transmission gate MOSFETs Q27 and Q29 connected in series with those transmission gate MOSFETs Q26 and Q28, moreover, there are commonly fed the output signals of CMOS inverter circuits IV2 and IV3 which act as delay circuits in response to the output signal of a NOR gate circuit G2 for receiving inverted write signals we1 to we4.

In order to sequentially receive the signals, which are fed sequentially from the external terminal I/O1, in synchronism with the selection signals pr1 to pr4, there is fed to the control input terminal of the NOR gate circuit G1 of the data input circuit a control signal 1e which is prepared through: a NOR gate circuit G3 receiving selection signals pr1 to pr4; a NOR gate circuit G4 responsive to the output signal of NOR gate circuit G3 and the write signal WE; and a CMOS inverter circuit IV6. For writing at the 1-bit unit, incidentally, a write signal we is fed to the control input terminal of the NOR gate circuit G4.

The common data line CD1 is coupled to the input terminal of the read circuit OB1 through a transmission gate MOSFET Q40 receiving at its gate a selection signal pr1 prepared by decoding the 2-bit address signal when reading. The read circuit OB1 consists of a sense amplifier and a data output circuit. The output terminal of the read circuit OB1 is connected to the external terminal I/O1 (or D1) and is brought into a high impedance state when operated other than during the reading operation.

Figure 4:
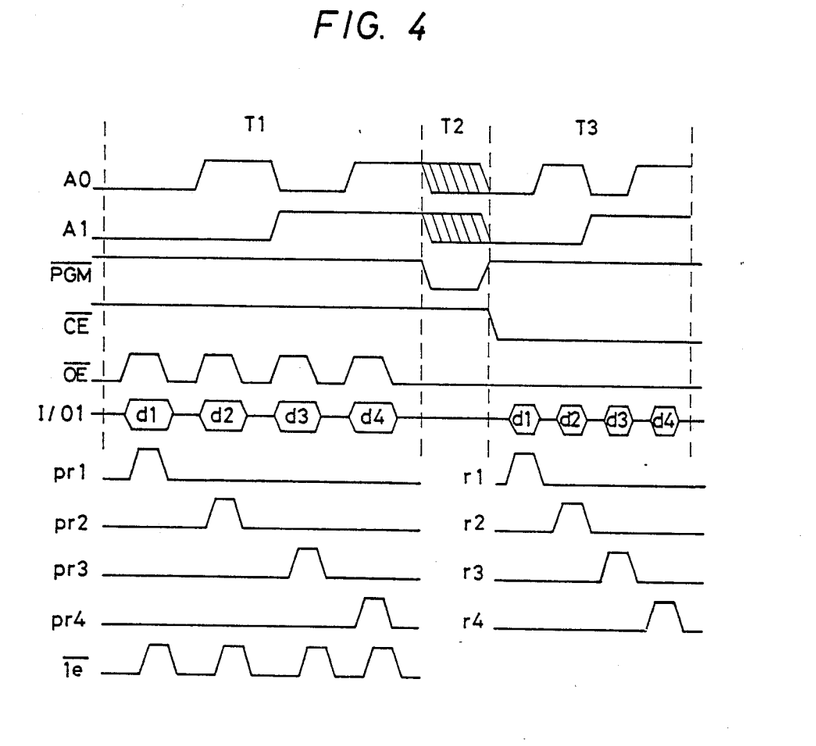
FIG. 4 is a timing chart of the programmable ROM of FIG. 2.

FIG. 4 is a timing chart for explaining one example of the operation of the EPROM device thus far described.

When the program signal $\overline{PGM}$ and the chip enable signal $\overline{CE}$ are at the high level whereas the output enable signal $\overline{OE}$ is at the low level, the control circuit CONT judges the page mode. In synchronism with the high level of the output enable signal $\overline{OE}$, moreover, the control circuit CONT decodes the address signals fed from the external terminals A0 and A1 to generate the selection signals pr1 to pr4. In this case, from the combination of the control signals $\overline{PGM}$, $\overline{CE}$ and $\overline{OE}$, the not-shown internal write signal we is left at the low level (whereas the signals $\overline{we1}$ to $\overline{we4}$ are at the high level), as is different from the usual writing operation. As a result, when the address signals A0 to A2 are at the low level, for example, the aforementioned selection signal pr1 is set at the high level. As a result, the control signal 1e, which is prepared by the delay through the NOR gate circuit G3, through the NOR gate circuit G4 acting substantially as the inverter circuit when the write signal we is set the low level, and through the CMOS inverter circuit IV6, is set at the low level. As a result, the NOR gate circuit G1 is opened so that a first write signal d1 is introduced into the latch circuit FF1 through the transmission gate MOSFET Q20 which has already come into its "on" state in response to the high level of the selection signal pr1.

Then, write signals d2 to d4, which are fed sequentially from the aforementioned external terminal I/O1 (or D1) in accordance with the combination of the high level of the control signal $\overline{OE}$ and the address signals A0 and A1, and introduced into latch circuit FF2 to FF4. In the present embodiment, the gates of the data input circuits are not opened to introduce the write signals before the transmission gate MOSFETs are selected. This makes it possible to introduce the write signals fed sequentially into an indicated latch circuit without fail. In an operation cycle T1 described above, the 4-bit serial write signals are introduced.

After this series operation cycle T1, if the program signal $\overline{PGM}$ is set at the low level in a subsequent operation cycle T2, the page write signal pw is set at the high level so that the transmission gate MOSFETs Q22, Q24 and so on are simultaneously brought into "on" states. As a result, the write signals d1 to dr stored in the latch circuits FF1 to FF4 are transmitted to the write circuits, in which either the high voltage $V_{pp}$ or the low level, such as ground potential, are generated according to the write signals d1 to d4. As a result, the common data line CD1 is fed selectively with the write high voltage $V_{pp}$ through the output MOSFETs Q35, which is to be turned on or off in accordance with the output signals of the aforementioned write circuits, so that the total 8×4 bits of writing operations selected by the respective four memory blocks MB1 to MB4 are conducted in the respective memory arrays MARY1 to MARY8.

In a subsequent operation cycle T3, if the chip enable signal $\overline{CE}$ is set at the low level, a verify mode is established. This operation is substantially similar to the usual reading operation so that the aforementioned selection signals r1 to r4 are generated in accordance with the changes in the address signals A0 and A1. As a result, if the circuit is normal, the same signals d1 to d4 as the written ones are read out in response to the address signals A0 and A1. However, the verify mode is different from the normal reading operation in that it is conducted with the high-voltage terminal $V_{pp}$ being fed with the high voltage.

Although not shown, when writing is conducted at the 1-bit (or totally 8 bits=1 byte) unit, the aforementioned chip enable signal $\overline{CE}$ is set at the low level. If, in this case, the address signal is fed to set the program signal $\overline{PGM}$ at the low level, the internal write signal we prepared by decoding the address signal is set at the high level so that the control signal 1e is set at the low level by the NOR gate circuit G4 and CMOS inverter circuit IV6. As a result, the gate circuit G1 of the data input circuit is opened to introduce the write signal fed from the external terminal D1.

In this case, according to the present embodiment, the memory cells of the four memory blocks MB1 to MB4 divided in each memory array are held in their selected states, and the four write circuits are provided. As a result, in order to ensure the writing operation for only one memory block selected, the output signals of the NOR gate circuit G2 and the CMOS inverter circuits IV2 and IV3 are delayed to the high level when one of the selection signals we1 to we4 prepared in accordance with the decoded signals of the address signals A0 and A1 is set at the high level. As a result, the write signal fed from the aforementioned external terminal is selected and transmitted to the input of one write circuit. The input terminals of the remaining write circuits are fixed at the ground potential of the circuit as a result of MOSFETs Q23 and Q25 being in the "on" states in response to the high level of the write signals $\overline{we1}$ to $\overline{we4}$ unselected.

The following advantages and results are attained in accordance with the present invention.

(1) The selecting operation is conducted by dividing the column (or data line) selecting path into the two steps, and the plural-bit write data are held by providing the latch circuit between the first and second selection circuits. By writing the held data simultaneously in the memory cell in one writing cycle, therefore, there can be attained an effect that high speed writing can be realized.

(2) Selecting is conducted by dividing the column selecting path into two steps. As a result, it is possible to reduce both the wiring length of the first common data lines CDL1 to CDL8 connected to the sense amplifiers and the number of the switch MOSFETs joined thereto so that stray capacitance can be reduced. This results in another effect that the read signals from the memory cells, which will appear at the outputs of the sense amplifiers, are speeded up so that high-speed reading can be realized.

(3) Selecting is conducted by dividing the column (or data line) selecting path into the two steps, and the plural-bit write data are held by providing the latch circuit between the first and second selection circuits. By writing the held data simultaneously in the memory cell in one writing cycle, therefore, there can be attained still another effect that high speed writing can be realized.

(4) In the aforementioned second column selecting circuit, a selection path which bypasses the aforementioned latch circuits is provided. This results in still a further effect that the reading operation of bit-by-bit from the memory arrays can be speeded up.

(5) In the aforementioned second column selecting circuit, there is provided a selection path which bypasses the aforementioned latch circuits. As a result, the writing operation of bit-by-bit for each memory array can be conducted. This results in a further effect the writing operation can also be conducted by the writer for general use.

The present invention made by us has been specifically described hereinbefore in connection with its embodiments but should not be limited thereto but can naturally be modified in various ways without departing from the inventive scope thereof. For example, the present invention can be applied not only to the simultaneously reading programmable ROM represented by the aforementioned 8-bit (or 1-byte) one but also to the 1-bit programmable ROM.

Each memory array may be constructed such that it is divided into eight blocks so that the eight bits may be written simultaneously for each memory array. The number of the memory arrays may be four or one. Moreover, the specific circuits of the column selecting circuits, or write circuits may take a variety of embodiment modes.

The foregoing description has been directed mainly to the invention conducted by us in connection with the EPROM device providing the field of application and the background of the invention. The present invention should not be limited thereto but can be applied widely to a variety of programmable ROMS which can be at least electrically written like the electrically erasable EEPROM.

What is claimed is:

1. In a semiconductor memory, the improvement for writing information comprising:
   a memory array having a plurality of data lines, including a plurality of nonvolatile semiconductor memory cells which can be erased and electrically written into;
   external terminal means for receiving serially applied input signals or an input signal to be written into said memory array;
   converter means having an input coupled to said external terminal means and having a plurality of outputs, said converter means responding to said serially applied input signals for converting said input signals into a plurality of parallel produced output signals;
   a plurality of terminals, corresponding in number to the number of outputs of said converter means, being respectively coupled to said outputs of said converter means, and being coupled to the data lines of said memory array;
   transmitting means having an input coupled to said external terminal means and having a plurality of outputs coupled to said terminals, said transmitting means responding to said input signal for controllably transmitting said input signal to one of said terminals;
   an external control terminal for receiving a control signal; and
   control means coupled to said converter means and to said transmitting means for selecting either a serial-to-parallel transmission of said serially received input signals through said converter means or transmitting said input signal through said transmitting means to one of said terminals in accordance with said control signal.

2. A semiconductor memory according to claim 1, wherein said converter means includes:
   a plurality of storage means for temporarily storing respective signals, said plurality of storage means corresponding in number to the number of said terminals and each having an input and an output, and wherein said converter means further includes first selector means for sequentially feeding said serially applied input signals, via a plurality of signal paths, to the inputs of said storage means, in accordance with first selecting signals; and
   wherein said control means includes means for providing said first selecting signals for sequentially indicating the order of the inputs of said storage means to be applied with respect to said converter means.

3. A semiconductor memory according to claim 2, wherein said control means further includes means for providing second selecting signals for selecting one of said terminals to be fed with an input signal via said transmitting means, and wherein said transmitting means includes second selector means for providing said input signal to a terminal indicated by said second selecting signals.

4. A semiconductor memory according to claim 3, wherein said control means provides said first selecting signals and said second selecting signals in accordance with said control signal.

5. A semiconductor memory according to claim 4, wherein said control signal includes a chip selection signal.

6. A semiconductor memory according to claim 5, further comprising an external terminal for receiving a writing voltage and a plurality of writing means coupled to said external terminal, wherein said plurality of writing means corresponds in number to the number of said terminals and are respectively coupled to said outputs of said plurality of storage means and to said terminals.

7. A semiconductor memory according to claim 6, further comprising gate means for inhibiting the operation of receiving said serially applied input signals through said converter means and the operation of receiving said input signal of said transmitting means when said control means does not indicate selection via either said converter means or said transmitting means.

8. A semiconductor memory according to claim 7, wherein each of said writing means includes a switching element which is coupled between said external terminal which receives said writing voltage and the corresponding terminal and which is controlled by the stored signal of the corresponding storage circuit means.

9. A semiconductor memory according to claim 7, further comprising inhibiting means for inhibiting an operation of writing means coupled to a terminal which is not selected by said second selecting signals.

10. A semiconductor memory according to claim 9, further comprising third selector means having inputs corresponding in number to the number of said terminals, being coupled to the respective terminals, and having outputs which are greater in number than the number of said terminals and which are represented by said data lines of the memory array, wherein selection of predetermined ones of said data lines is in accordance with third selecting signals.

11. A semiconductor memory according to claim 10, wherein said memory array further comprises word lines; and
   fourth selector means, responsive to fourth selecting signals, for selecting a word line.

12. A semiconductor memory according to claim 11, wherein each of said nonvolatile semiconductor memory cells comprises a FAMOS transistor.

13. In a semiconductor memory, the improvement for writing information comprising:
   a memory array including a plurality of word lines, a plurality of data lines intersecting said word lines, and a plurality of semiconductor nonvolatile memory cells respectively provided at the intersections between said data lines and word lines, wherein said semiconductor nonvolatile memory cells can be erased and electrically written into;
   a plurality of common data lines;
   first selecting means for selecting a word line of said plurality of word lines in accordance with first address signals;
   second selecting means for selecting ones of said plurality of data lines, and for respectively coupling each one of said common data lines selected with corresponding ones of said data lines selected in accordance with second address signals;
   external terminal means for receiving serially applied input signals or an input signal to be written into said memory array;
   external means for receiving a writing voltage;
   a plurality of writing circuits, each having a terminal coupled to said external means and having an input and an output;
   plurality of storage means, each having an input and an output, for temporarily storing respective input signals;
   control means for providing first and second selecting signals;
   third selecting means for sequentially feeding said input signals, via a plurality of signal paths, to the inputs of said plurality of storage means, in accordance with said first selecting signals provided from said control means;
   transmitting means, having an input coupled to said external terminal means and a plurality of outputs respectively coupled to said inputs of said writing circuits, for transmitting said input signal to an input of a corresponding one of said plurality of writing circuits in accordance with said second selecting signals provided from said control means;
   control terminal means for receiving a control signal, said control means being coupled to said control terminal means, to said third selecting means, and to said transmitting means, for providing one of said first and second selecting signals in accordance with said control signal; and
   inhibiting means for inhibiting the operation of said plurality of writing circuits and the transmitting of said input signal by said transmitting means,
   wherein said plurality of writing circuits correspond in number to the number of said common data lines and its outputs are respectively coupled to said common data lines, said plurality of storage means correspond in number to the number of said writing circuits and its outputs are respectively coupled to the inputs of said writing circuits for providing said temporarily stored signals to said writing circuits, and wherein there are a greater number of said data lines than the number of said common data lines.

14. A semiconductor memory according to claim 13, wherein each of said writing circuits includes a switching element which is coupled between said external means and the corresponding common data line.

15. A semiconductor memory according to claim 14, wherein in each of said writing circuits said switching element includes a MOSFET which has a first electrode coupled to said external means, a second electrode coupled to the corresponding common data line and a gate electrode coupled to the output of the corresponding storage means and to the corresponding output of said transmitting means.

16. A semiconductor memory according to claim 15, wherein said second selecting means comprises a first decoder, responsive to said second address signals, and a first switch circuit, said switch circuit coupling said common data lines to ones of said plural data lines in response to the output of said first decoder.

17. A semiconductor memory according to claim 16, wherein said third selecting means comprises a second decoder, responsive to said first selecting signals, and a second switch circuit, said second switch circuit, in response to the output of said second decoder, sequentially feeding the input signals, applied serially to said external terminal means, to the respective storage circuit means.

18. A semiconductor memory according to claim 17, wherein said semiconductor nonvolatile memory cells comprise FAMOS transistors.

19. A semiconductor memory according to claim 18, wherein said control signal includes a chip selection signal.

20. A semiconductor memory according to claim 19, wherein each one of said writing circuits further includes a series connection of a transmission gate and an inverter circuit coupled between an output of a corresponding storage means and the gate electrode of the corresponding MOSFET switching element, wherein said inverter circuit is coupled between said external means, for receiving said writing voltage, and reference potential terminal and wherein said inverter circuit further includes a pull-up switch coupled between an input of said inverter circuit and said external terminal means, said pull-up switch having a control terminal coupled to the output of said inverter circuit.

21. A semiconductor memory according to claim 20, wherein in each of said writing circuits said transmission gate and said switching element are N-channel MOSFETs, said inverter circuit is a CMOS logic inverter and said pull-up switch is a P-channel MOSFET.

22. A semiconductor memory according to claim 16, wherein said second selecting means, in response to said second address signals, selects one data line from each group of data lines of a memory array having a plurality of such data line groups, wherein each group is associated with an equally divided portion of said memory array.

23. A semiconductor memory according to claim 22, wherein said memory array is associated with a respective external terminal for selectively receiving serially applied input signals or an input signal to be written into said memory array, and wherein there are a plurality of such memory arrays, each one being associated with a corresponding external terminal, a corresponding plurality of data lines, a corresponding plurality of common data lines, a plurality of writing circuits, a corresponding plurality of storage means and corresponding transmitting means.

24. A semiconductor memory according to claim 15, wherein each one of said writing circuits further include a series connection of a transmission gate and an inverter circuit coupled between an output of a corresponding storage means and the gate electrode of the corresponding MOSFET switching element, wherein said inverter circuit is coupled between said external means, for receiving said writing voltage, and reference potential terminal and wherein said inverter circuit further includes a pull-up switch coupled between an input of said inverter circuit and said external terminal means, said pull-up switch having a control terminal coupled to the output of said inverter circuit.

25. A semiconductor memory according to claim 24, wherein in each of said writing circuits said transmission gate and said switching element are N-channel MOSFETs, said inverter circuit is a CMOS logic inverter and said pull-up switch is a P-channel MOSFET.

26. A semiconductor memory according to claim 13, wherein said second selecting means, in response to said second address signals, selects one data line from each group of data lines of a memory array having a plurality of such data line groups, wherein each group is associated with an equally divided portion of said memory array.

27. A semiconductor memory according to claim 26, wherein said memory array is associated with a respective external terminal for selectively receiving serially applied input signals or an input signal to be written into said memory array, and wherein there are a plurality of such memory arrays, each one being associated with a corresponding external terminal, a corresponding plurality of data lines, a corresponding plurality of common data lines, a corresponding plurality of writing circuits, a corresponding plurality of storage means and corresponding transmitting means.

* * * * *